United States Patent
Ivanov et al.

(10) Patent No.: US 6,807,040 B2
(45) Date of Patent: Oct. 19, 2004

(54) OVER-CURRENT PROTECTION CIRCUIT AND METHOD

(75) Inventors: Vadim V. Ivanov, Tucson, AZ (US); David R. Baum, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 464 days.

(21) Appl. No.: 09/839,981

(22) Filed: Apr. 19, 2001

(65) Prior Publication Data

US 2002/0181180 A1 Dec. 5, 2002

(51) Int. Cl.$^7$ .................................................. H02H 9/08
(52) U.S. Cl. ..................................... 361/93.9; 361/93.1
(58) Field of Search ........................ 361/93.9, 18, 93.1; 327/323

(56) References Cited

U.S. PATENT DOCUMENTS

| | | | |
|---|---|---|---|
| 3,796,943 A | 3/1974 | Nelson et al. .................. | 323/9 |
| 4,321,648 A | 3/1982 | Kaplan ........................ | 361/101 |
| 4,644,288 A | 2/1987 | Stanley ........................... | 330/2 |
| 4,714,898 A | 12/1987 | Botti et al. .................. | 330/298 |
| 4,789,842 A | 12/1988 | Naxera ....................... | 330/298 |
| 5,365,194 A | 11/1994 | Sands, Jr. .................... | 330/253 |
| 5,383,082 A * | 1/1995 | Nishizawa .................. | 361/93.1 |
| 5,519,310 A | 5/1996 | Bartlett ....................... | 323/316 |
| 5,739,712 A | 4/1998 | Fujii ........................... | 327/323 |
| 6,169,439 B1 * | 1/2001 | Teggatz et al. ............. | 327/309 |
| 6,347,029 B1 * | 2/2002 | Ouyang et al. ............. | 361/93.9 |

OTHER PUBLICATIONS

"Dynamic Safe–Area Protection for Power Transistors Employs Peak–Temperature Limiting" by Robert J. Widlar and Mineo Yamatake, IEEE Journal of Solid–State Circuits, vol. SC–22, No. 1, Feb. 1987, pp. 77–84.

"A 15–W Monolithic Power Operational Amplifier" by Paul R. Gray, IEEE Journal of Solid–State Circuits; vol. SC–7, No. 6, Dec. 1972, pp. 474–480.

"High–Gain 15–W Monolithic Power Amplifier With Internal Fault Protection" by Ernest L. Long and Thomas M. Frederiksen, IEEE Journal of Solid–State Circuits, vol. SC–6, No. 1, Feb. 1971, pp. 35–44.

"Power Integrated Circuits: Problems, Tradeoffs, and Solutions" by Bruno Murari, IEEE Journal of Solid–State Circuits, vol. SC–13, No. 3, Jun. 1978, pp. 307–319.

* cited by examiner

*Primary Examiner*—Brian Sircus
*Assistant Examiner*—James A Demakis
(74) *Attorney, Agent, or Firm*—W. Daniel Swayze, Jr.; W. James Brady; Frederick J. Telecky, Jr.

(57) ABSTRACT

Over-current protection is accomplished in an output transistor (MP) of an electronic circuit wherein an input signal (Vgatedrive) Is Applying to a first conductor (19) coupled to a gate of the output transistor to cause an output current (Iout) to flow through the output transistor and an output terminal (11) of the electronic circuit. A limit voltage ($V_{LIMIT}$) who is applied to an input (21) of a voltage clamping circuit (18) to cause a clamping current to flow in the first conductor (19) as needed to prevent the magnitude of the input signal (Vgatedrive) from being less than the magnitude of the limit voltage ($V_{LIMIT}$) so that the output current (Iout) is limited to a maximum current limit determined by the limit voltage ($V_{LIMIT}$). A control signal ($I_{LIMIT}$/n) is applied to an input of a current-to-voltage conversion circuit (20) to cause the current-to-voltage conversion circuit to produce the limit voltage ($V_{LIMIT}$), which is applied to an emitter of a first transistor (Q1) having a collector in base connected to a bias current source (I1). The resulting voltage on a base of the first transistor is applied to a base of a second transistor (Q2), and the input signal (Vgatedrive) is applied to the first conductor (19).

19 Claims, 5 Drawing Sheets

OVER-CURRENT PROTECTION CIRCUIT AND METHOD

BACKGROUND OF THE INVENTION

The present invention relates generally to over-current protection circuits, which also are referred to herein as current limit circuits. More particularly, the present invention relates to an adjustable over-current protection circuit which achieves a fast response time and a high degree of accuracy despite large manufacturing process variations and despite large chip operating temperature variations, without use of a sense resistor or a separate external adjustment terminal.

Many electronic circuits include components which limit output current of the circuit to protect output transistors and/or other circuit components, such as load circuits driven by output transistors of the electronic circuits, from excessive output currents. Power amplifiers for driving low resistance loads usually include over-current protection circuitry to prevent the power amplifiers, especially output transistors therein, from being damaged by an overload current caused by a short-circuit of the amplifier output. Various techniques have been used to sense and limit output currents of various circuits and to protect output transistors from excessive output currents, i.e., from over-currents. These methods are used primarily in two classes of protection circuits: 1) those including a sense resistor to sense current in an output transistor, and 2) those which do not include such a sense resistor.

The first class of protection circuits, those with a sense resistor, conventionally place a small value resistor in the current path of the output transistor to sense the output current therein. For relatively large values of output transistor current, the voltage drop across the sense resistor reduces the available "headroom", i.e., the available voltage range or available voltage swing of signals such as the output signal of the electronic circuit. Also, the increased temperatures caused by power dissipation in the sense resistor can become excessive and cause damage to output transistors or other circuitry that is sensitive to high temperatures.

A prior art example of the first class of protection circuits is shown in FIG. 1, wherein protection circuit 10 senses the output current flowing through two sense resistors Rsc1 and Rsc2 by measuring the voltage across each of them. When the voltage across either Rsc1 or Rsc2 exceeds the base-to-emitter voltage (Vbe) of transistor Q3 or Q4, the current through transistor Q1 or transistor Q2, respectively, is limited and the output current therefore is also limited. For example, when the current through Rsc1 exceeds the base-to-emitter voltage of transistor Q3, then transistor Q3 "robs" base current from transistor Q1. This limits the current through resistor Rsc1 and hence through transistor Q1, and thereby protects output transistor Q1 and also limits the output current. The current through output transistor Q2 is limited in a similar way. The current limit value is determined by the values of Rsc1 and Rsc2, and because it Rsc1 and Rsc2 are fixed resistors, the current limit of the protection circuit must also be fixed, or there must be external terminals through which Rsc1 and Rsc2 may be adjusted. The current flowing through Rsc1 and Rsc2 causes those resistors to dissipate power and increase temperatures of nearby components on the integrated circuit chip. The tolerance of the current limit is no more accurate than the Vbe (base-to-emitter voltage) voltage of Q3 or the Vbe voltage of Q4. Because of the large tolerances, and because the Vbe of each of the transistors changes with temperature, the output current protection (or current limit value) is undesirably imprecise.

U.S. Pat. No. 5,739,712 by Fujii (April, 1998) discloses a number of other similar over-current protection schemes.

Protection circuits in the second class do not directly limit the current, but instead usually rely on a feedback circuit to control the current limit. An example of the second class of protection circuits is disclosed in U.S. Pat. No. 5,519,310 to Bartlett (May 1996), titled "Voltage-to-Current Converter Without Series Resistor." Referring to FIG. 2 herein, which is a reproduction of FIG. 3 of the Bartlett patent, the output current Iout of voltage-to-current converter circuit 12 is controlled by adjusting the current flowing through transistor M1. The differential amplifier OA2 compares the voltage across transistor M1 to a voltage between transistors M2 and M5, and adjusts the gate voltage of transistor M5 accordingly. The current flowing through transistors M3 and M5 is mirrored through transistor M4 and resistor R1. This mirrored current creates a feedback voltage VF voltage across resistor R1. The feedback voltage VF is compared with an input voltage Vin by differential amplifier OA1, which adjusts the gate voltage of M1 so as to increase Iout enough to force the voltage across resistor R1 to be equal to Vin. This causes Iout to be proportional to the current through resistor R1 and hence to Vin. However, the feedback delay in limiting the output current Iout may allow it to exceed the current desired to be established by Vin, and thereby cause chip overheating and damage to the output transistor M1 and other circuit components. The feedback delay also slows the overall response of a system including the circuit of FIG. 2.

Thus, there is an unmet need for an improved over-current protection circuit that does not dissipate excessive power and raise chip temperature, does not reduce operating voltage "head room", and does not cause substantial signal propagation delay.

SUMMARY OF THE INVENTION

It is an object of the present invention to provide an over-current protection circuit which achieves a higher degree of accuracy than previous protection circuits.

It is another object of the present invention to provide an over-current protection technique which more reliably protects output transistors of integrated circuits than previous techniques.

It is another object of the present invention to provide an over-current protection circuit or current limit protection circuit having faster response times than the closest prior art.

It is another object of the invention to provide an over-current protection circuit or a current limit circuit for protecting output transistors of integrated circuits which is adjustable over a wide range.

It is another object of the invention to provide an over-current protection circuit or a current limit protection circuit with high accuracy over large chip temperature variations and large manufacturing process variations.

It is also an object of the invention to provide a method of current control which can have symmetrical positive and negative current limits with a high degree of accuracy.

It is another object of the present invention to provide an over-current protection circuit in amplifier circuitry or output driver circuitry which drives a load circuit so as to provide a wide range of adjustability of output limit currents.

It is another object of the present invention to provide an over-current protection circuit which drives a load circuit so as to provide "on the fly" adjustability of output limit currents supplied to the wide range of load circuits.

Briefly described, and in accordance with one embodiment, the present invention provides a method and apparatus for directly limiting the output current of an over-current protection circuit in an electronic device without being subject to the delays caused by feedback loops. By directly limiting the voltage at the gate of the output transistor of the over-current protection circuit to a maximum voltage value, the current through the output transistor is correspondingly limited. By generating the maximum voltage value in reference to a current which is representative of the maximum current desired for the over-current protection circuit, the desired over-current protection is accurately achieved.

In one embodiment of the invention, an over-current protection circuit is provided having an output transistor, the gate of which is driven by an input voltage that controls the current flowing through the output transistor. When the input voltage goes beyond a voltage limit, a voltage clamp circuit maintains the gate voltage of the output transistor at the voltage limit until the input voltage is no longer beyond the voltage limit. The voltage limit is generated in response to a current which is representative of the desired maximum current through the output transistor. According to another embodiment of the invention, the voltage clamp includes an amplifier circuit to increase the accuracy of a clamp which limits the gate voltage driving the output transistor so as to provide a "hard", rather than "soft" limiting of the output current of the amplifier circuit.

DETAILED DESCRIPTION OF THE PREFERRED EMBODIMENTS

Figure 1:
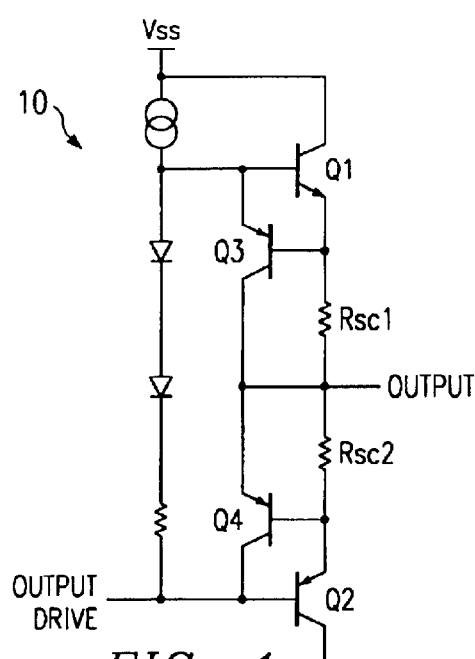
FIG. 1 is a schematic diagram of a prior art output circuit that includes over-current protection circuitry including output current sense resistors.
Figure 2:
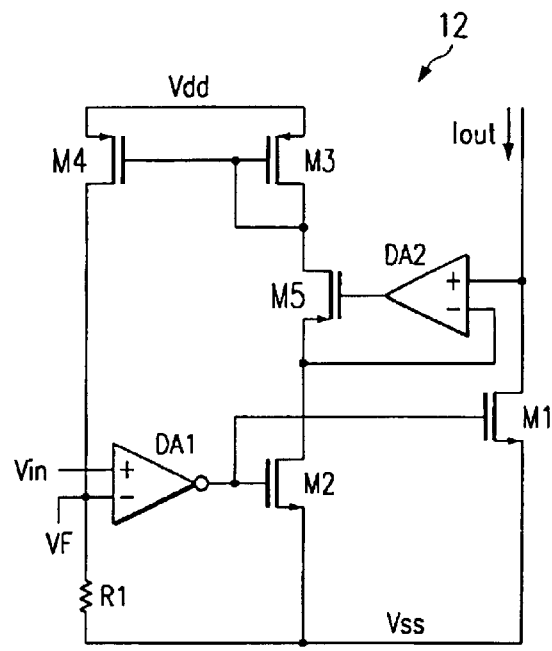
FIG. 2 is a schematic diagram of a prior art voltage-to-current converter that accomplishes over-current protection by using a feedback loop rather than a current sense resistor.
Figure 3:
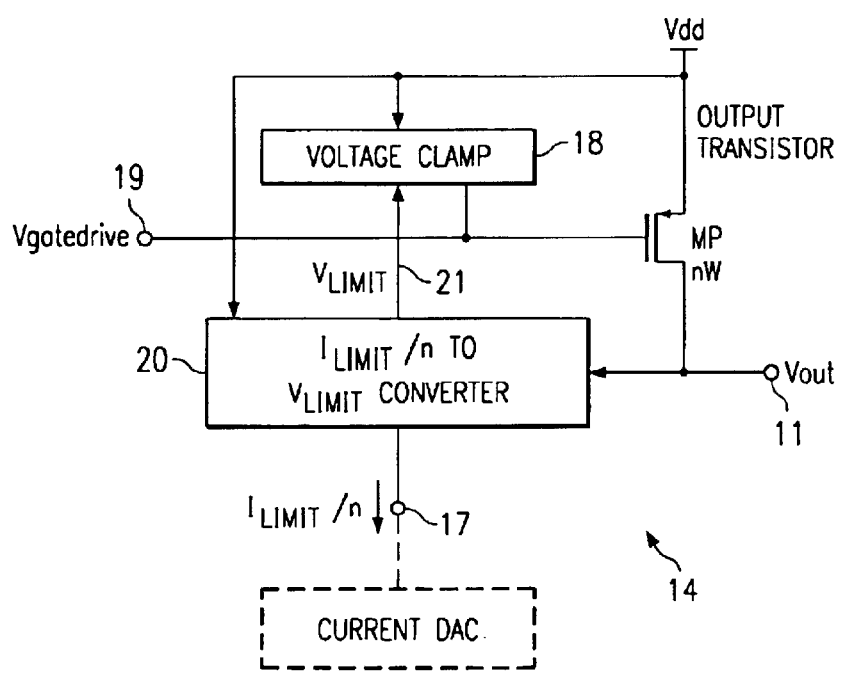
FIG. 3 is an overall block diagram of an over-current protection circuit according to the present invention.

FIG. 3 illustrates a block diagram of an over-current protection circuit 14 including a P-channel output transistor MP, a voltage clamp circuit 18, and an $I_{LIMIT}/n$ to $V_{LIMIT}$ converter circuit 20. Output transistor MP has its source connected to $V_{DD}$ its drain connected to an output conductor 11 on which an output voltage Vout is produced, and its drain connected by conductor 19 to a voltage Vgatedrive. Vgatedrive also is applied to an input of voltage clamp circuit 18. Vout is fed back to to $I_{LIMIT}/n$-to-$V_{LIMIT}$ converter circuit 20, which converts a current limit control signal $I_{LIMIT}/n$ flowing out of terminal 17 to the limit voltage $V_{LIMIT}$ on conductor 21. $V_{LIMIT}$ is applied as an input to voltage clamp circuit 18. Typically, Vgatedrive is provided by a previous amplifier stage of the device. This device can be part of an operational amplifier, a low dropout voltage regulator, or a bridge circuit. The current limit control signal $I_{LIMIT}/n$ can be provided by any suitable circuit, for example, by a current DAC (digital-to-analog converter) has indicated and dashed lines.

Figure 4:
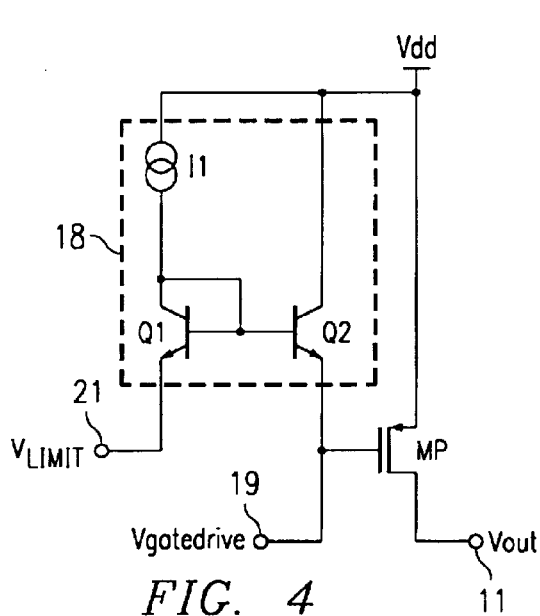
FIG. 4 is a schematic diagram of a basic voltage clamp, configured for sourcing current, which may be used in the over-current protection circuit of FIG. 3.

FIG. 4 illustrates one implementation of voltage clamp circuit 18 of FIG. 3 and its connection to output transistor MP. The drain of output transistor MP is connected to Vout by output conductor 11, its source is connected to $V_{DD}$, and its gate is connected to Vgatedrive by conductor 19 and to the emitter of an NPN transistor Q2. The collector of transistor Q2 is connected to $V_{DD}$ and its base is connected to the base and collector of a diode-connected NPN transistor Q1 and one terminal of a constant current source I1. The emitter of transistor Q1 is connected to $V_{LIMIT}$ by conductor 21. This embodiment of the voltage clamp 18 and output transistor MP functions as a current source, supplying an output current flowing out of conductor 11. Voltage clamp circuit 18 functions to effectively "clamp" the voltage of gate of the output transistor 16 so as to limit Vgatedrive to values equal to or above $V_{LIMIT}$. If Vgatedrive is above $V_{LIMIT}$, then transistor Q2 is off, so all of the bias current I1 flows through transistor Q1. However, if Vgatedrive begins to go below $V_{LIMIT}$, then transistor Q2 begins to turn on rapidly with respect to further decreases in Vgatedrive, and thereby "clamps" Vgatedrive at $V_{LIMIT}$.

Figure 5:
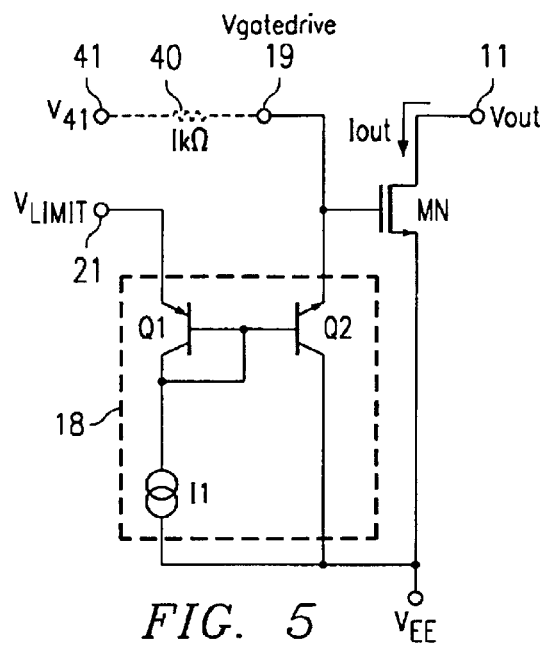
FIG. 5 is a schematic diagram of a basic voltage clamp, configured for sinking current, which may be used in an over-current protection circuit that is a mirror image of the one shown in FIG. 3.

Similarly, FIG. 5 illustrates a mirror image implementation of voltage clamp circuit 18 of FIG. 3 and its connection to N-channel output transistor MN, wherein transistors Q1 and Q2 are PNP transistors. The voltage clamp circuit 18 of FIG. 5 functions as a current sink, sinking an external output current flowing into output conductor 11. In FIG. 5, voltage clamp circuit 18 functions to effectively "clamp" the voltage of gate of the output transistor MN so as to limit Vgatedrive to values below or equal to $V_{LIMIT}$. If Vgatedrive is below $V_{LIMIT}$, then transistor Q2 is off, so all of the bias current I1 flows through transistor Q1. However, if Vgatedrive begins to go above $V_{LIMIT}$, then transistor Q2 begins to turn on rapidly with respect to further increases in Vgatedrive, and thereby "clamps" Vgatedrive at $V_{LIMIT}$ volts.

Figure 6:
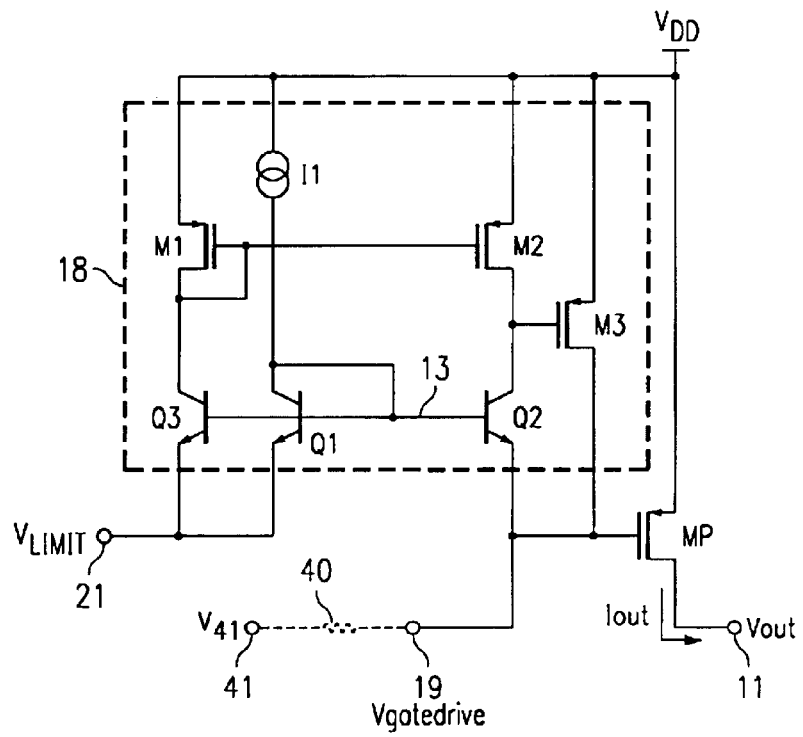
FIG. 6 is a schematic diagram of a voltage clamp similar to the voltage clamp of FIG. 4 and further including amplifier circuitry to produce a "hard" output current limit.

FIG. 6 discloses an improved embodiment of the voltage clamp circuit 18 of FIG. 4 which produces a more linear and more "solid" or "hard" clamping of Vgatedrive to $V_{LIMIT}$. Because the circuits shown in FIGS. 4 and 5 may suffer from non-linearities caused by changes in the base-to-emitter voltage Vbe of each of transistors Q1 and Q2, a feedback amplifier is included to improve the precision with which the voltage clamp circuit 18 clamps in the Vgatedrive voltage to the $V_{LIMIT}$ voltage. By including the feedback amplifier circuit formed by additional transistors M1, M2, M3 and Q3, the non-linearities caused by the variation in the Vbe voltages of Q1 and Q2 in response to changes in the currents through them are reduced. The emitter and base of NPN transistor Q3 are connected by conductors 21 and 13 to the emitter and base, respectively, of transistor Q1. P-channel transistor M1 has its source connected to $V_{DD}$. The gate and drain of transistor M1 are connected to the collector of NPN transistor Q3. The gate of transistor M1 is connected to the gate of P-channel transistor M2, the source of which is connected to $V_{DD}$. The drain of transistor M2 is connected to the collector of transistor Q2 and the gate of P-channel transistor M3, the source of which is connected to $V_{DD}$. The drain of transistor M3 is connected to a circuit providing Vgatedrive by conductor 19.

Still referring to FIG. 6, perhaps the operation of the amplifier M1, M2, M3, Q3 in clamp circuit 18 can be best understood by comparing its operation with that of the clamp circuit 18 of FIG. 4. Referring to FIG. 4, if the voltage Vgatedrive starts going below $V_{LIMIT}$, then transistor Q2 begins turning on harder than transistor Q1, and more of the constant current I1 goes into the base of transistor Q2 and less goes into the base of transistor Q1. If Vgatedrive goes still lower, and all of the current I1 flows into the base of transistor Q2, and if Vgatedrive goes even lower, then there is no more limiting of the current through output transistor MP, because transistor Q2 can provide no further current into the circuit (not shown) pulling Vgatedrive lower. Therefore, there is nothing to resist Vgatedrive from going still lower, and therefore nothing to prevent the gate-to-source turn on voltage of transistor MP from further increasing and causing transistor MP to deliver more output current. Consequently, the voltage clamp circuit of FIG. 4 no longer functions as a voltage clamp. (This situation can readily occur if the clamp circuit of FIG. 4 is included in an operational amplifier driving a load which demands a large amount of output current from the operational amplifier while feedback circuitry causes Vgatedrive to be a very strong signal.) Curves Y of the graph of subsequently described FIG. 7A illustrate the gradual "soft" current limit established by the clamp circuit of FIG. 4.

However, adding the amplifier Q3, M1, M2, M3 in FIG. 6 solves the "softness" problem that occurs in the clamp circuit of FIG. 4 when current source I1 supplies all of its current into the base of transistor Q2, because the amplifier Q3, M1, M2, M3 operates to continue to supply current through transistor M3 to a circuit which is producing Vgatedrive. As Vgatedrive goes lower, the voltage on the base of transistor Q2, and hence also on the base of transistor Q3, is pulled lower, tending to turn off transistor Q3. This reduces the current through diode-connected load transistor M1 and hence also reduces the corresponding amount of current mirrored through transistor M2. That lowers the voltage on the gate of transistor M3, turning it on harder, resulting in additional current flowing from the drain of transistor M3 into conductor 19 and into the circuit generating Vgatedrive. Curves X of the graph of FIG. 7A show the "hard limit" produced by the clamp circuit of FIG. 6 as a result of including the amplifier Q3, M1, M2, M3.

The above described amplifier circuit and voltage clamp circuit 18 of FIG. 6 allow reduction in the amount of chip area required for transistor Q1, and allow the amount of current supplied by current source I1 to be decreased. The amplifier circuit Q3, M1, M2, M3 nevertheless permits the signal Vgatedrive, and thus the output current Iout through the output transistor 16, to be directly limited by the value of $V_{LIMIT}$. Similar amplifier circuitry (not shown) to that of FIG. 6 may of course be provided for the current sinking voltage clamp circuit of FIG. 5.

Figure 7:
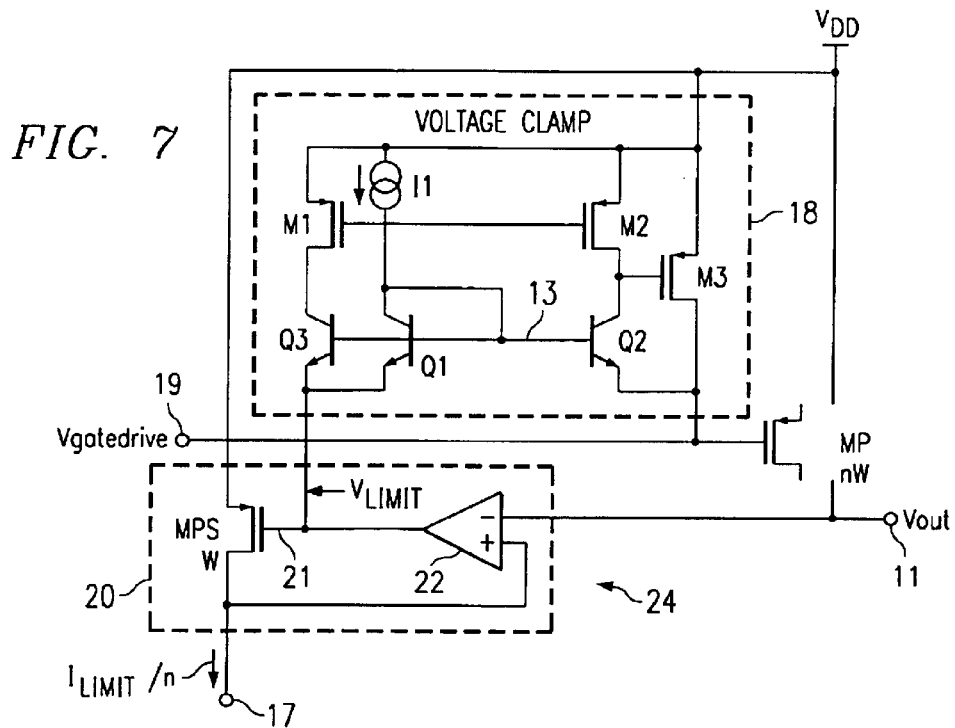
FIG. 7 is a schematic diagram of an over-current protection circuit including an output transistor, a voltage clamp, and an $I_{LIMIT}/n$ to $V_{LIMIT}$ converter.
Figure 7A:
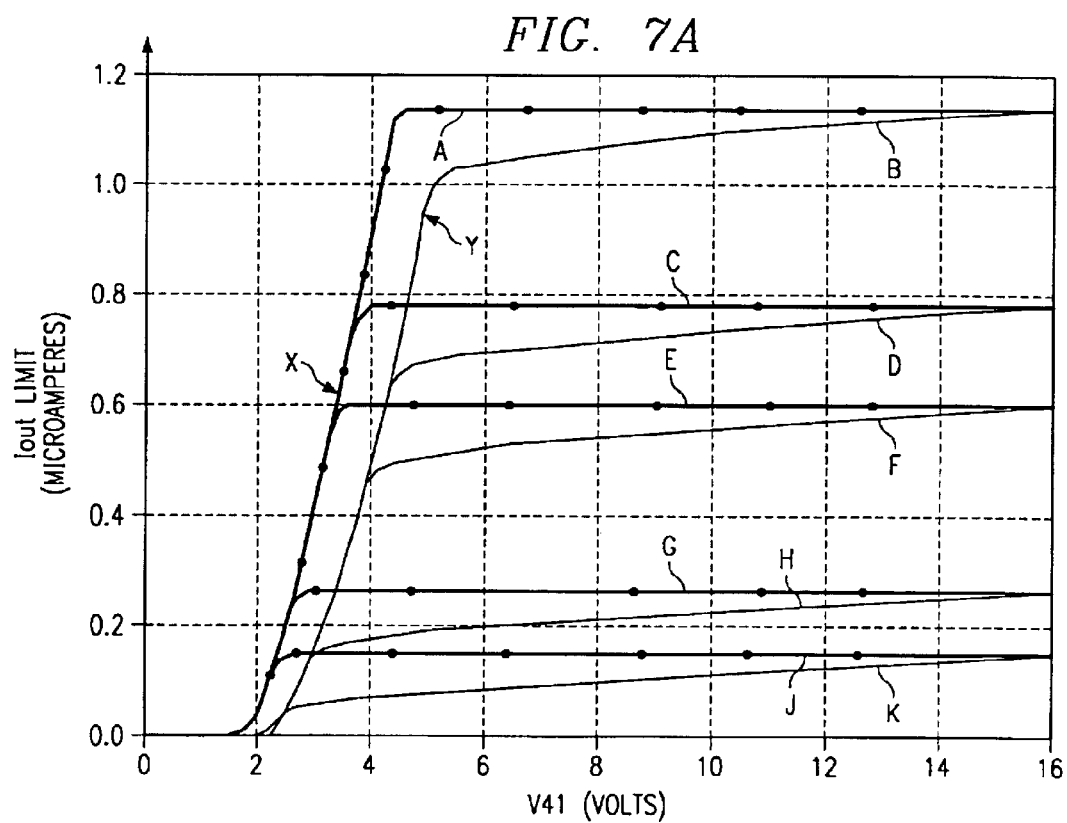
FIG. 7A is a graph illustrating the "soft limit" achieved by the circuit of FIG. 4 and the "hard limit" achieved by the circuit of FIG. 6.

Referring to FIG. 7, the value of $V_{LIMIT}$ is generated by $I_{LIMIT}/n$ to $V_{LIMIT}$ converter circuit 20, which includes a P-channel sense transistor MPS and an operational amplifier 22 having its output connected by conductor 21 to the gate of a sense transistor MPS. The (−) of amplifier 22 is connected by output conductor 11 to receive the output voltage Vout, and its (+) input is connected by conductor 17 to the drain of sense transistor MPS, the source of which is connected to $V_{DD}$. The other circuitry in FIG. 7 is connected the same as in FIG. 6.

Still referring to FIG. 7, a scaled-by-n value of the desired output limit current $I_{LIMIT}/n$ flows through sense transistor MPS. The drain voltage of sense transistor MPS is kept equal to the output voltage Vout by the feedback circuitry including operational amplifier 22. The gate voltage of sense transistor MPS is the desired limit voltage $V_{LIMIT}$, which is determined as indicated in the equations set forth below. The ratio of the maximum output current Iout to $I_{LIMIT}$ is therefore equal to the ratio of the W/L ratios of the output transistor MP to that of sense transistor MPS.

The drain current of transistor MPS in its forward active region is:

$$I_{DMPS} = \left\{\frac{\mu C_{ox} W_{MPS}}{2L_{MPS}}\right\}(V_{GSMPS} - V_t)^2(1 + \lambda V_{DSMPS}) \qquad \text{Eq. (1)}$$

where:

$W_{MPS}$=channel width of transistor MPS
$L_{MPS}$=channel length of transistor MPS
$V_{GSMPS}$=gate-to-source voltage of transistor MPS
$V_{DSMPS}$=drain-to-source voltage of transistor MPS.

Re-arranging terms:

$$(V_{GSMPS} - V_t)^2 = \frac{I_{DMPS}}{\left\{\frac{\mu C_{ox} W_{MPS}}{2L_{MPS}}\right\}(1 + \lambda V_{DSMPS})} \qquad \text{Eq. (2)}$$

Further re-arranging of terms results in:

$$(V_{GSMPS} - V_t)^2 = \frac{2I_{DMPS} L_{MPS}}{(\mu C_{ox} W_{MPS})(1 + \lambda V_{DSMPS})} \qquad \text{Eq. (3)}$$

Solving for $V_{GSMPS}$ results in:

$$V_{GSMPS} = \text{SQRT}\left\{\frac{2I_{DMPS} L_{MPS}}{(\mu C_{ox} W_{MPS})(1 + \lambda V_{DSMPS})}\right\} + V_t \qquad \text{Eq. (4)}$$

A similar derivation of $V_{GSMP}$ results in:

$$V_{GSMPS} = \text{SQRT}\left\{\frac{2I_{DMP} L_{MP}}{(\mu C_{ox} W_{MP})(1 + \lambda V_{DSMP})}\right\} + V_t \qquad \text{Eq. (5)}$$

The feedback provided by operational amplifier 22 in FIG. 7 ensures that:

$$V_{DSMPS} = V_{DSMP} \qquad \text{Eq. (6)}$$

The channel lengths of transistors MP and MPS are set equal, so:

$$L_{MP} = L_{MPS} \qquad \text{Eq. (7)}$$

Since under current limit conditions, both transistors MP and MPS will have the same gate-to-source voltage:

$$V_{GSMPS} = V_{GSMP} \qquad \text{Eq. (8)}$$

Therefore, above equations (5) and (6) can be set equal, resulting in the following equation:

$$\text{SQRT}\left\{\frac{2I_{DMP}L_{MP}}{(\mu C_{ox}W_{MP})(1+\lambda V_{DSMP})}\right\} + V_t = \quad\text{Eq. (9)}$$

$$\text{SQRT}\left\{\frac{2I_{DMPS}L_{MPS}}{(\mu C_{ox}W_{MPS})(1+\lambda V_{DSMPS})}\right\} + V_t,$$

wherein SQRT {X} means the square root of X. Then:

$$\text{SQRT}\left\{\frac{2I_{DMP}L_{MP}}{(\mu C_{ox}W_{MP})(1+\lambda V_{DSMP})}\right\} = \quad\text{Eq. (10)}$$

$$\text{SQRT}\left\{\frac{2I_{DMPS}L_{MPS}}{(\mu C_{ox}W_{MPS})(1+\lambda V_{DSMPS})}\right\}$$

Then: $\quad\frac{2I_{DMP}L_{MP}}{(\mu C_{ox}W_{MP})(1+\lambda V_{DSMP})} = \frac{2I_{DMPS}L_{MPS}}{(\mu C_{ox}W_{MPS})(1+\lambda V_{DSMPS})} \quad$ Eq. (11)

Since $L_{MP}=L_{PS}$ and $V_{DSMP}=V_{DSMPS}$, then:

$$\frac{I_{DMP}}{W_{MP}} = \frac{I_{DMPS}}{W_{MPS}} \quad\text{Eq. (12)}$$

Solving $$I_{DMP} = I_{DMPS} \cdot \frac{W_{MP}}{W_{MPS}} \quad\text{Eq. (13)}$$

Therefore, the maximum current through output transistor MP can be set by the ratio of the channel width's of transistors MP and MPS. If $W_{MPS}=W$, $W_{MP}=nW$, where n is the ratio between the channel widths of output transistor MP and sense transistor MPS, and if:

$$I_{DMP}=I_{limit}, \quad\text{Eq. (14)}$$

then:

$$I_{limit} = I_{DMPS} \times \frac{W \times n}{W} \quad\text{Eq. (15)}$$

and:

$$I_{limit}=n \times I_{DMPS} \quad\text{Eq. (16)}$$

Therefore, the drain current of transistor MPS is equal to $I_{LIMIT}/n$, as shown in FIG. 7.

Therefore, the maximum current through output transistor MP may be set by the ratio of the width of the output transistor MP to the width of the sense transistor MPS. In other words, by adjusting the widths of the channels for either the output transistor MP, or the sense transistor MPS, the range of the allowable maximum output current may be accurately selected.

The feedback from Vout through amplifier 22 causes $V_{LIMIT}$ to be a function of Vout, so $V_{LIMIT}$ is a function of both $I_{LIMIT}/n$ and Vout, which is another important advantage of the invention.

Therefore, the maximum output current limit for a particular operating condition can be easily established by selecting the value of $I_{LIMIT}/n$ drawn out of terminal 17. This is an important advantage, because it allows an amplifier or voltage regulator in which the over-current protection circuit 24 is incorporated to be readily adapted to drive a wide variety of load circuits having input current limitations. In fact, by providing a current DAC (current digital-to-analog converter) as shown by dashed lines in FIG. 3 to draw out of conductor 17, the current limit through output transistor MP can be adjusted "on-the-fly".

FIG. 7A is a graph useful in comparing the voltage clamping performance of the clamp circuits of FIG. 5 and FIG. 6. The graph shows two sets of curves, curves X and curves Y. Curves X are for the clamp circuit of FIG. 6, and curves Y are for the clamp circuit of FIG. 5. To obtain curves X, a 1 kilohm resistor 40 is connected between conductor 19 and conductor 41 in the clamp circuit 18 of FIG. 6, as indicated in dashed lines. The voltage V41 is swept from zero volts to 16 volts, along the horizontal axis of FIG. 7A for five different values of $I_{LIMIT}/n$ to produce the curves A, C, E, G, and J which constitute the set of curves X. The upper portions of curves A, C, E, G, and J have a slope of nearly zero. This indicates that the values of the output current Iout are clamped at constant limit currents irrespective of the values of V41 and Vgatedrive for each different value of $I_{LIMIT}/n$, respectively, for the clamp circuit 18 of FIG. 6. This occurs because transistor M3 supplies any additional current into conductor 19 that is required to clamp Vgatedrive to $V_{LIMIT}$ but is not supplied by transistor Q2 and therefore limit Iout to a level determined by $I_{LIMIT}/n$.

The provision of transistor M3 to provide the excess current into conductor 19 allows the current source I1 and transistor Q2 to be much smaller than otherwise would be required, and permits transistor Q2 to remain in linear operation, providing a much more linear clamp circuit.

To obtain curves Y in FIG. 7A, a 1 kilohm resistor 40 is connected between conductor 19 and conductor 41 in the clamp circuit 18 of FIG. 5, as indicated in dashed lines. The voltage V41 is swept from zero volts to 16 volts, along the horizontal axis of FIG. 7A for five different values of $I_{LIMIT}/n$ to produce the curves B, D, F, H, and K which constitute the set of curves Y. The upper portions of curves B, D, F, H, and K have a slope of substantially greater than zero. This indicates that the values of the output current Iout are "clamped" at limit current values which vary substantially as a function of V41 and Vgatedrive for each different value of $I_{LIMIT}/n$, respectively, for the clamp circuit 18 of FIG. 5. The clamp circuit of FIG. 5 is much less linear with respect to Vgatedrive than the clamp circuit of FIG. 6.

The size of transistor Q2 and the size of current source I1 must be quite large in order to supply enough base current to enable transistor Q2 to reliably clamp Vgatedrive to $V_{LIMIT}$, as would be required to prevent damage to transistor MN during an overcurrent condition.

Thus, the clamp circuit of FIG. 6 is the better clamp circuit, because it does not allow Vgatedrive to go below the set value of $V_{LIMIT}$.

Figure 8:
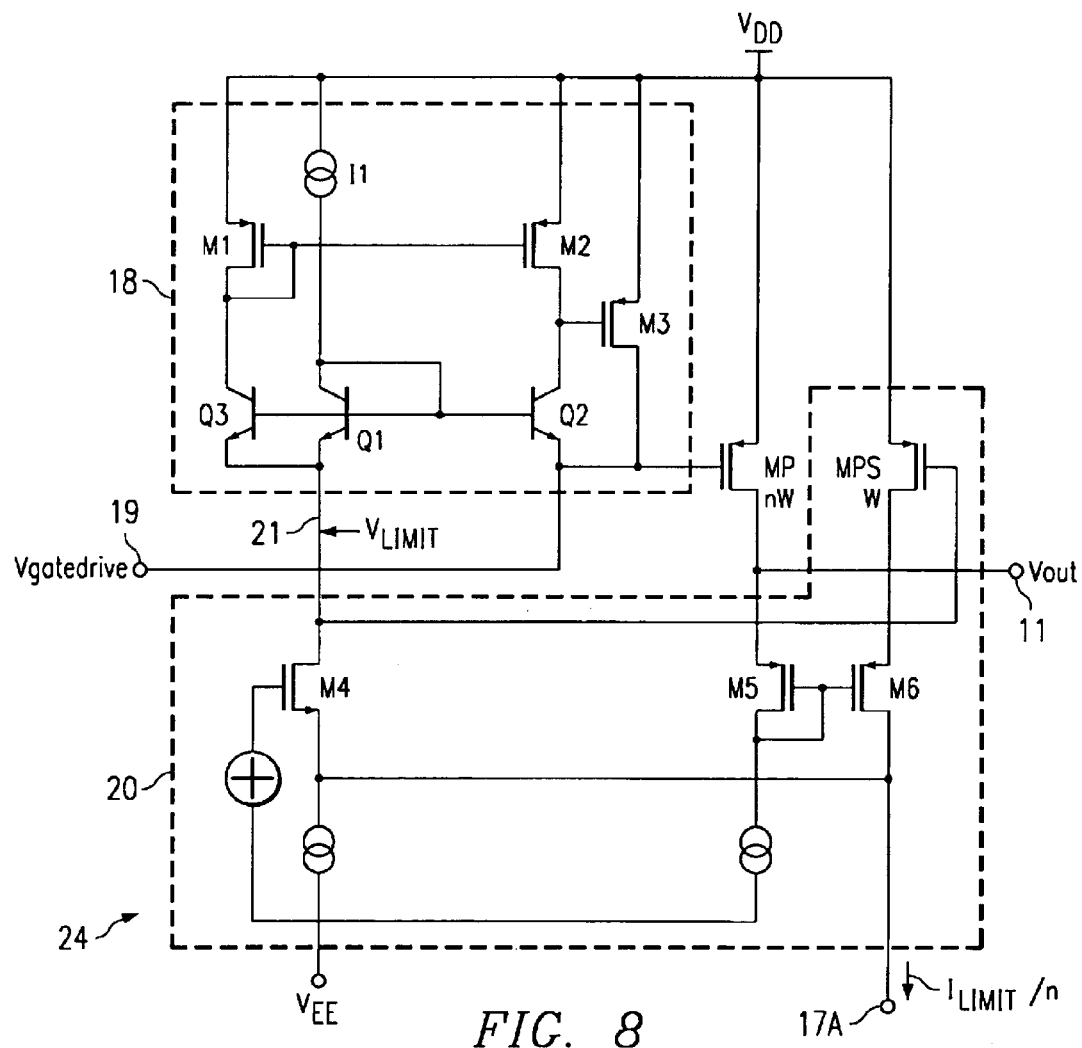
FIG. 8 is a schematic diagram of a preferred embodiment of an over-current protection circuit.

FIG. 8 merely illustrates a specific implementation of an output current protection circuit 24, and also including an implementation of the operational amplifier 22 shown in FIG. 7.

Figure 9:
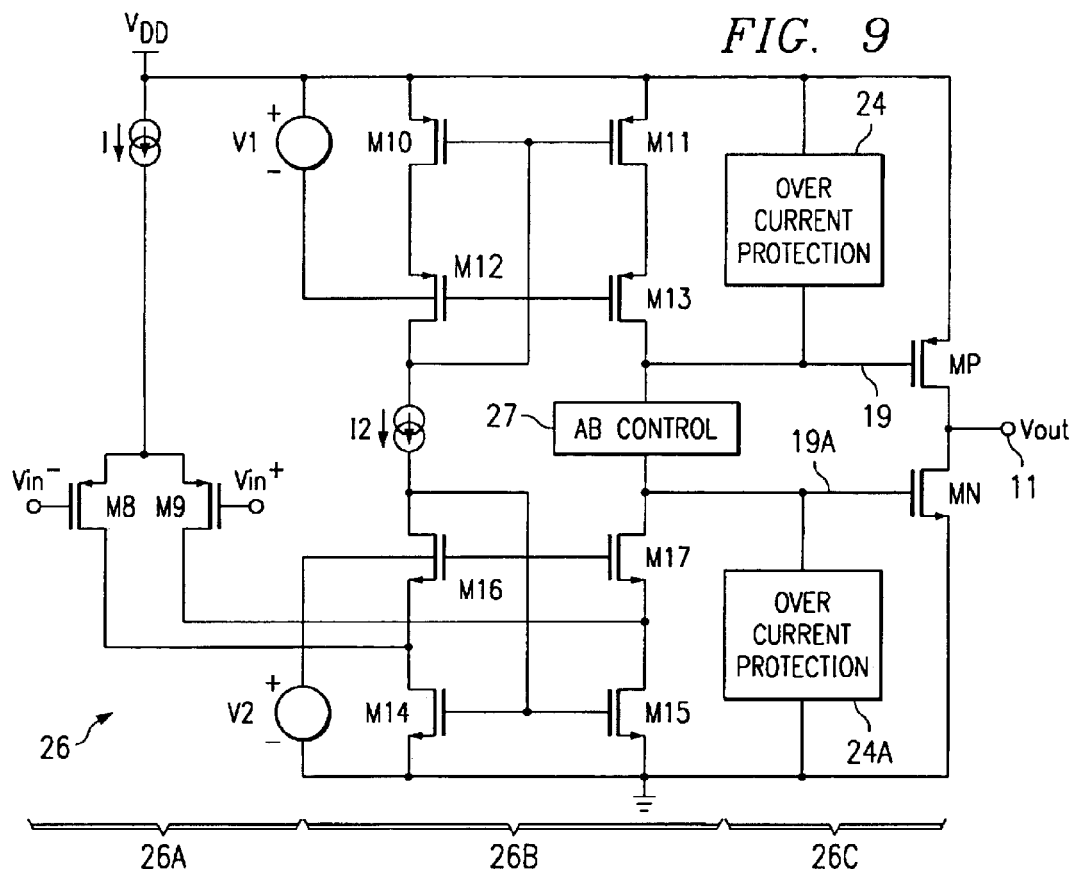
FIG. 9 is a block diagram of an amplifier with an over-current protection circuit.

Referring to FIG. 9, an operational amplifier 26 includes a differential input stage 26A including a pair of differentially connected P-channel input transistors M8 and M9 having their sources connected to a tail current source I. The drains of transistors M8 and M9 are connected to a folded cascode circuit 26B. A similar pair of differentially connected N-channel input transistors (not shown) having their gates connected to the gates of transistors M8 and M9, respectively, and their drains connected to the sources of folded cascode transistors M12 in M13, respectively, would usually be provided, but are omitted for convenience of illustration. The output conductors 19 and 19A of folded cascode circuit 26B are coupled to the terminals of a conventional class AB control circuit 27.

In accordance with present invention, conductor 19 also is connected to one terminal of over-current protection circuit 24 and to the gate of an N-channel output pull up transistor MP having its drain connected to output conductor 11, wherein over-current protection circuit 24 and pull up transistor MP together can be essentially the same as the circuit 24 shown in FIG. 7. Conductor 19A his connected to one terminal of an over-current protection circuit 24A and the gate of an N-channel output pulldown transistor MN having its drains connected to output conductor 11. Over-current protection circuit 24A can be a mirror image over-current protection circuit 24 except that in circuit 24A the P-channel transistors of circuit 24 are replaced by N-channel transistors, the NPN transistors are replaced by PNP transistors, and the supply voltage conductor $V_{DD}$ in circuit 24 is replaced by ground.

Figure 10:
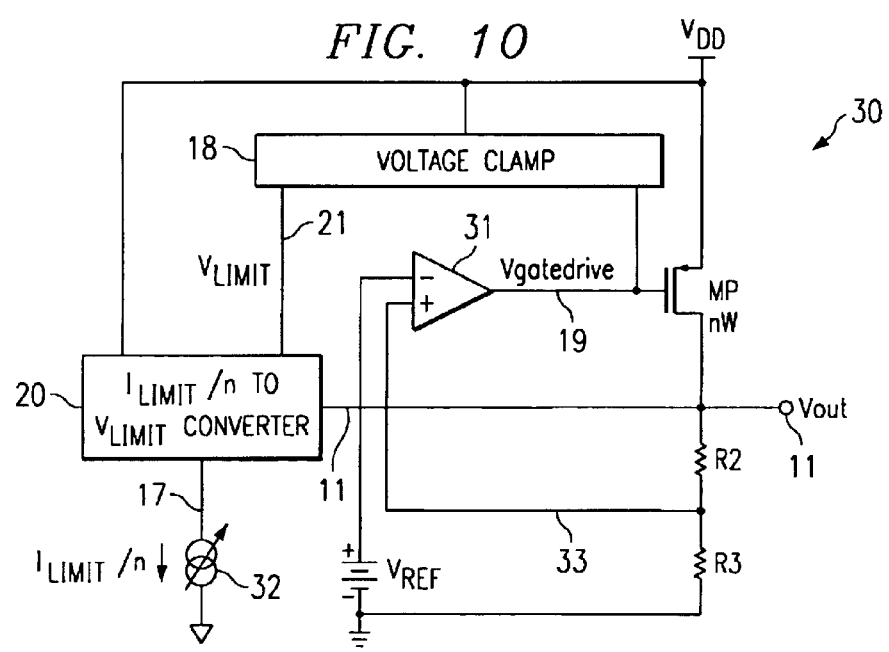
FIG. 10 is a schematic diagram of a voltage regulator circuit including an amplifier with an over-current protection circuit.

Referring to FIG. 10, in accordance with one embodiment of the invention, a low drop out voltage regulator 30 includes over-current protection circuitry including $I_{LIMIT}/n$ to $V_{LIMIT}$ converter circuit 20 and voltage clamp circuit 18 as described above, with P channel output transistor MP functioning as the output transistor of the voltage regulator 30. The voltage Vgatedrive on conductor 19 is produced by an operational amplifier 31 having its (−) input coupled to the (+) terminal of a reference voltage circuit having its (−) terminal connected to ground and producing a constant reference voltage $V_{REF}$. The drain of output transistor MP is connected by conductor 11 to one terminal of a resistor R2, the other terminal of which is connected by conductor 33 to the (+) input of operational amplifier 31 and to one terminal of a resistor R3. The other terminal of resistor R3 is connected to ground. Terminal 17 of $I_{LIMIT}/n$ to $V_{LIMIT}$ converter 20 is connected to an adjustable current source 32 which produces the control current $I^{LIMIT}/n$ that establishes the value of $V_{LIMIT}$ on conductor 21.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

What is claimed:

1. An electronic circuit including an over-current protection circuit therein, the over-current protection circuit comprising:

(a) an output transistor having a drain coupled to an output terminal of the electronic circuit, a gate directly coupled a first conductor to receive an input voltage, and a source coupled to a supply voltage conductor;

(b) a control circuit for producing a limit voltage, the control circuit having a first terminal coupled to a second conductor for conducting a control signal and a second terminal coupled to a third conductor for conducting the limit voltage;

(c) a voltage clamping circuit having a first terminal coupled to the third conductor to receive the limit voltage and a second terminal coupled to the first conductor to receive the input voltage; and (d) the control circuit and the voltage clamp circuit coacting to limit a current in the output transistor to a maximum value determined by the control signal.

2. An electronic circuit including an over-current protection circuit therein, the over-current protection circuit comprising:

(a) an output transistor having a drain coupled to an output terminal of the electronic circuit, a gate directly coupled a first conductor to receive an input voltage, and a source coupled to a supply voltage conductor;

(b) a control circuit for producing a limit voltage, the control circuit having a first terminal coupled to a second conductor for conducting a control signal and a second terminal coupled to a third conductor for conducting the limit voltage;

(c) a voltage clamping circuit having a first terminal coupled to the third conductor to receive the limit voltage and a second terminal coupled to the first conductor to receive the input voltage; and (d) the control circuit and the voltage clamp circuit coacting to electrically isolate the first conductor from the third conductor when the magnitude of the input voltage exceeds the magnitude of the limit voltage and to prevent a current in the output transistor from increasing enough to exceed a maximum current limit determined by the control signal when the magnitude of the input voltage is less than the magnitude of the limit voltage.

3. An electronic circuit including an over-current protection circuit therein, the over-current protection circuit comprising:

(a) an output transistor having a drain coupled to an output terminal of the electronic circuit, a gate coupled a first conductor to receive an input voltage and a source coupled to a supply voltage conductor;

(b) a control circuit for producing a limit voltage, the control circuit having a first terminal coupled to a second conductor for conducting a control signal and a second terminal coupled to a third conductor for conducting the limit voltage;

(c) a voltage clamping circuit having a first terminal coupled to the third conductor to receive the limit voltage and a second terminal coupled to the first conductor to receive the input voltage;

(d) the control circuit and the voltage clamp circuit coacting to electrically isolate the first conductor from the third conductor when the magnitude of the input voltage exceeds the magnitude of the limit voltage and to prevent a current in the output transistor from increasing enough to exceed a maximum current limit determined by the control signal when the magnitude of the input voltage is less than the magnitude of the limit voltage;

(e) wherein the voltage clamping circuit includes a first transistor having an emitter coupled to the third conductor and a base and collector both coupled to a bias current source, and a second transistor having a base coupled to the base and collector of the first transistor, an emitter coupled to the first conductor, and a collector coupled to the supply voltage conductor.

4. The electronic circuit of claim 3 wherein the output transistor is a P-channel transistor, and wherein the first and second are NPN transistors.

5. An electronic circuit including an over-current protection circuit therein, the over-current protection circuit comprising:

(a) an output transistor having a drain coupled to an output terminal of the electronic circuit, a gate coupled a first conductor to receive an input voltage, and a source coupled to a supply voltage conductor;

(b) a control circuit for producing a limit voltage, the control circuit having a first terminal coupled to a second conductor for conducting a control signal and a second terminal coupled to a third conductor for conducting the limit voltage: (C) a voltage clamping circuit having a first terminal coupled to the third conductor to receive the limit voltage and a second terminal coupled to the first conductor to receive the input voltage;

(d) the control circuit and the voltage clamp circuit coacting to electrically isolate the first conductor from the third conductor when the magnitude of the input voltage exceeds the magnitude of the limit voltage and to prevent a current in the output transistor from Increasing enough to exceed a maximum current limit determined by the control signal when the magnitude of the input voltage Is less than the magnitude of the limit voltage;

(e) wherein the voltage clamping circuit includes a first transistor having an emitter coupled to the third conductor and a base and collector both coupled to a bias current source, a second transistor having a base coupled to the base and collector of the first transistor, an emitter coupled to the first conductor, a third transistor having an emitter coupled to the third conductor, a base coupled to the base and collector of the first transistor, and a collector coupled to a drain and gate of a fourth transistor having a source coupled to the supply voltage conductor, a fifth transistor having a source coupled to the supply voltage conductor, a gate coupled to the gate and drain of the fourth transistor, and a drain coupled to a collector of the second transistor, and a sixth transistor having a source coupled to the supply voltage conductor, a gate coupled to the collector of the second transistor, and a drain coupled to the first conductor wherein the third, fourth, fifth, and sixth transistors coact to cause additional current to flow in the first conductor as needed to prevent the current in the output transistor from increasing enough to exceed a maximum current limit determined by the control signal when the magnitude of the input voltage is less than the magnitude of the limit voltage.

6. The electronic circuit of claim 5 wherein the output transistor and the fourth, fifth, and sixth transistors are P-channel transistors, and wherein the first, second, and third transistors are NPN transistors.

7. An electronic circuit including an over-current protection circuit therein, the over-current protection circuit comprising:

(a) an output transistor having a drain coupled to an output terminal of the electronic circuit, a gate directly coupled to a first conductor receive an input voltage, and a source coupled to a supply voltage conductor;

(b) a current-to-voltage converter circuit for producing a limit voltage in response to a reference current, the current-to-voltage converter circuit having a first terminal for conducting the reference current, a second terminal for conducting the limit voltage, and a third terminal connected to the output terminal of the electronic circuit;

(c) a voltage clamping circuit having a first terminal coupled to the second terminal of the current-to-voltage converter to receive the limit voltage, and a second terminal coupled to the gate of the output transistor to receive the input voltage, the output transistor; and (d) the current-to-voltage converter circuit, and the voltage clamp circuit coacting to limit the current in the output transistor to a maximum value determined by the reference current.

8. An electronic circuit including an over-current protection circuit therein, the over-current protection circuit comprising:

(a) an output transistor having a drain coupled to an output terminal of the electronic circuit, a gate directly coupled to receive an input voltage, and a source coupled to a supply voltage conductor;

(b) a current-to-voltage converter circuit for producing a limit voltage in response to a reference current, the current-to-voltage converter circuit having a first terminal for conducting the reference current, a second terminal for conducting the limit voltage, and a third terminal connected to the output terminal of the electronic circuit;

(c) a voltage clamping circuit having a first terminal coupled to the third conductor to receive the limit voltage and a second terminal coupled to the first conductor to receive the input voltage;

(d) the control circuit and the voltage clamp circuit coacting to electrically isolate the first conductor from the third conductor when the magnitude of the input voltage exceeds the magnitude of the limit voltage and to prevent a current in the output transistor from increasing enough to exceed a maximum current limit determined by the control signal when the magnitude of the input voltage is less than the magnitude of the limit voltage.

9. An electronic circuit including an over-current protection circuit therein, the over-current protection circuit comprising:

(a) an output transistor having a drain coupled to an output terminal of the electronic circuit, a gate coupled to receive an input voltage, and a source coupled to a supply voltage conductor;

(b) a current-to-voltage converter circuit for producing a limit voltage in response to a reference current, the current-to-voltage converter circuit having a first terminal for conducting the reference current, a second terminal for conducting the limit voltage, and a third terminal connected to the output terminal of the electronic circuit;

(c) a voltage clamping circuit having a first terminal coupled to the third conductor to receive the limit voltage and a second terminal coupled to the first conductor to receive the input voltage;

(d) the control circuit and the voltage clamp circuit coacting to electrically isolate the first conductor from the third conductor when the magnitude of the input voltage exceeds the magnitude of the limit voltage and to prevent a current in the output transistor from increasing enough to exceed a maximum current limit determined by the control signal when the magnitude of the input voltage is less than the magnitude of the limit voltage;

(e) wherein the voltage clamping circuit includes a first transistor having an emitter coupled to the third conductor and a base and collector both coupled to a bias current source, and a second transistor having a base coupled to the base and collector of the first transistor, an emitter coupled to the first conductor, and a collector coupled to the supply voltage conductor.

10. An electronic circuit including an over-current protection circuit therein, the over-current protection circuit comprising:

(a) an output transistor having a drain coupled to an output terminal of the electronic circuit, a gate coupled to receive an input voltage, and a source coupled to a supply voltage conductor;

(b) a current-to-voltage converter circuit for producing a limit voltage in response to a reference current, the current-to-voltage converter circuit having a first terminal for conducting the reference current, a second terminal for conducting the limit voltage, and a third terminal connected to the output terminal of the electronic circuit;

(c) a voltage clamping circuit having a first terminal coupled to the third conductor to receive the limit voltage and a second terminal coupled to the first conductor to receive the input voltage;

(d) the control circuit and the voltage clamp circuit coacting to electrically isolate the first conductor from the third conductor when the magnitude of the input voltage exceeds the magnitude of the limit voltage and to prevent a current in the output transistor from increasing enough to exceed a maximum current limit determined by the control signal when the magnitude of the input voltage is less than the magnitude of the limit voltage;

(e) wherein the voltage clamping circuit includes a first transistor having an emitter coupled to the third conductor and a base and collector both coupled to a bias current source, a second transistor having a base coupled to the base and collector of the first transistor, an emitter coupled to the first conductor, a third transistor having an emitter coupled to the third conductor, a base coupled to the base and collector of the first transistor, and a collector coupled to a drain and gate of a fourth transistor having a source coupled to the supply voltage conductor, a fifth transistor having a source coupled to the supply voltage conductor, a gate coupled to the gate and drain of the fourth transistor, and a drain coupled to a collector of the second transistor, and a sixth transistor having a source coupled to the supply voltage conductor, a gate coupled to the collector of the second transistor, and a drain coupled to the first conductor;

wherein the third, fourth, fifth, and sixth transistors coact to cause additional current to flow in the first conductor as needed to prevent the current in the output transistor from increasing enough to exceed a maximum current limit determined by the control signal when the magnitude of the input voltage is less than the magnitude of the limit voltage.

11. The electronic circuit of claim 10 wherein the output transistor and the fourth, fifth, and sixth transistors are P-channel transistors, and wherein the first, second, and third transistors are NPN transistors.

12. An electronic circuit including an over-current protection circuit therein, the over-current protection circuit comprising:

(a) an output transistor having a drain coupled to an output terminal of the electronic circuit, a gate coupled to receive an input voltage, and a source coupled to a supply voltage conductor;

(b) a current-to-voltage converter circuit for producing a limit voltage in response to a reference current, the current-to-voltage converter circuit having a first terminal for conducting the reference current, a second terminal for conducting the limit voltage, and a third terminal connected to the output terminal of the electronic circuit;

(c) a voltage clamping circuit having a first terminal coupled to the third conductor to receive the limit voltage and a second terminal coupled to the first conductor to receive the input voltage;

(d) the control circuit and the voltage clamp circuit coacting to electrically isolate the first conductor from the third conductor when the magnitude of the input voltage exceeds the magnitude of the limit voltage and to prevent a current in the output transistor from increasing enough to exceed a maximum current limit determined by the control signal when the magnitude of the input voltage is less than the magnitude of the limit voltage;

(e) wherein the current-to-voltage converter includes a sense transistor having a source coupled to the supply voltage conductor, a drain coupled to the first terminal, and a gate coupled to the second terminal, and an operational amplifier having an output coupled to the second terminal, a first input coupled to the first terminal, and a second terminal coupled to the output terminal.

13. A method of providing over-current protection in an output transistor of an electronic circuit, comprising:

(a) applying an input signal to a first conductor directly coupled to a gate of the output transistor to cause an output current to flow through the output transistor and an output terminal of the electronic circuit;

(b) applying a limit voltage to an input of a voltage clamping circuit; and (c) operating the voltage clamping circuit to cause a clamping current to flow in the first conductor as needed to prevent the input signal from having a value that is beyond a predetermined level relative to the limit voltage wherein the output current is prevented from having a value greater than a current limit determined by the limit voltage.

14. A method of providing over-current protection in an output transistor of an electronic circuit, comprising:

(a) applying an inDut signal to a first conductor couoled to a aate of the outout transistor to cause an outPut current to flow through the output transistor and an output terminal of the electronic circuit;

(b) applying a limit voltage to an input of a voltage clamping circuit; and (c) operating the voltage clamping circuit to cause a clamping current to flow in the first conductor as needed to prevent the input signal from having a value that is beyond a predetermined level relative to the limit voltage wherein the output current is prevented from having a value greater than a current limit determined by the limit voltage, wherein step (a) includes applying the input signal to the first conductor by means of an output of an amplifier circuit.

15. A method of providing over-current protection in an output transistor of an electronic circuit, comprising:

(a) applying an input signal to a first conductor coupled to a gate of the output transistor to cause an output current to flow through the output transistor and an output terminal of the electronic circuit;

(b) applying a limit voltage to an input of a voltage clamping circuit; and (c) operating the voltage clamping circuit to cause a clamping current to flow in the first conductor as needed to prevent the input signal from having a value that is beyond a predetermined level relative to the limit voltage wherein the output current is prevented from having a value greater than a current limit determined by the limit voltage, wherein step (b) includes applying a control signal to an input of a current-to-voltage conversion circuit to cause the current-to-voltage conversion circuit to produce the limit voltage.

16. A method of providing over-current protection in an output transistor of an electronic circuit, comprising:

(a) applying an input signal to a first conductor coupled to a gate of the output transistor to cause an output current to flow through the output transistor and an output terminal of the electronic circuit;

(b) applying a limit voltage to an input of a voltage clamping circuit; and (c) operating the voltage damping circuit to cause a clamping current to flow in the first conductor as needed to prevent the input signal from having a value that is beyond a predetermined level relative to the limit voltage wherein the output current is prevented from having a value greater than a current limit determined by the limit voltage, wherein step (b) includes applying the limit voltage to an emitter of a first transistor having a collector in base connected to a bias current source, and applying the resulting voltage on a base of the first transistor to a base of a second transistor, and step (a) includes applying the input signal to the first conductor.

17. The method of claim 16 wherein step (c) includes operating the second transistor to cause the clamping current to flow into the first conductor whenever the input signal turns the second transistor on.

18. The method of claim 16 wherein step (c) further includes operating a third transistor having a source coupled to the supply voltage conductor and having a drain coupled to the first conductor to cause an additional current to flow in the first conductor in response to the turning on all the second transistor.

19. The method of claim 18 including operating a current mirror circuit in response to a collector current of a fourth transistor having a base and emitter connected to the base and emitter, respectively, of the first transistor to provide a load device coupled to a collector of the second transistor and applying a voltage of collector of the second transistor to a gate of the third transistor to turn the third transistor off when the second transistor is off and to turn the third transistor on when the second transistor is on.

* * * * *